US012655320B2

(12) United States Patent
Park et al.

(10) Patent No.: US 12,655,320 B2
(45) Date of Patent: Jun. 16, 2026

(54) POLISHING COMPOSTION FOR SEMICONDUCTOR PROCESS, MANUFACTURING METHOD OF POLISHING COMPOSITION AND METHOD FOR MANUFACTURING SEMICONDUCTOR DEVICE BY USING THE SAME

(71) Applicant: SK enpulse Co., Ltd., Gyeonggi-do (KR)

(72) Inventors: Han Teo Park, Seoul (KR); Deok Su Han, Seoul (KR); Jang Kuk Kwon, Seoul (KR); Seung Chul Hong, Seoul (KR)

(73) Assignee: YCCHEM CO., LTD., Gyeongsangbuk-do (KR)

( * ) Notice: Subject to any disclaimer, the term of this patent is extended or adjusted under 35 U.S.C. 154(b) by 579 days.

(21) Appl. No.: 18/043,451

(22) PCT Filed: Aug. 31, 2021

(86) PCT No.: PCT/KR2021/011691
§ 371 (c)(1),
(2) Date: Feb. 28, 2023

(87) PCT Pub. No.: WO2022/045866
PCT Pub. Date: Mar. 3, 2022

(65) Prior Publication Data
US 2023/0332014 A1 Oct. 19, 2023

(30) Foreign Application Priority Data

Aug. 31, 2020 (KR) ........................ 10-2020-0109795
Aug. 30, 2021 (KR) ........................ 10-2021-0114855

(51) Int. Cl.
C09G 1/02 (2006.01)
B24B 37/04 (2012.01)
H10P 95/00 (2026.01)

(52) U.S. Cl.
CPC .............. *C09G 1/02* (2013.01); *B24B 37/044* (2013.01); *H10P 95/06* (2026.01)

(58) Field of Classification Search
None
See application file for complete search history.

(56) References Cited

U.S. PATENT DOCUMENTS

2007/0102664 A1 5/2007 Choung et al.
2012/0058642 A1* 3/2012 White ............... H01L 21/02024
438/693

FOREIGN PATENT DOCUMENTS

CN 101372089 A 2/2009
CN 111315836 A 6/2020
(Continued)

OTHER PUBLICATIONS

Search Report for Singapore Patent Application No. 11202301527Y completed by the Intellectual Property Office of Singapore on Oct. 17, 2024.
(Continued)

*Primary Examiner* — Binh X Tran
(74) *Attorney, Agent, or Firm* — IP & T GROUP LLP

(57) ABSTRACT

The present invention relates to a semiconductor process polishing composition and a semiconductor device manufacturing method in which the polishing composition is applied, and can provide a preparation method applied to a CMP process for an amorphous carbon layer, and thus exhibits a high polishing rate, prevents, during a CMP process, the re-adsorption of carbon residue on a semiconductor substrate and the contamination of a polishing pad, and stabilizes an accelerator in the polishing composition so (Continued)

that the storage stability thereof is excellent. In addition, provided is a semiconductor device manufacturing method in which the semiconductor process polishing composition is applied.

6 Claims, 2 Drawing Sheets

(56) References Cited

FOREIGN PATENT DOCUMENTS

| | | | |
|---|---|---|---|
| EP | 1870928 | A1 | 12/2007 |
| KR | 10-0643628 | B1 | 11/2006 |
| KR | 10-2017-0040452 | A | 4/2017 |
| KR | 20170040452 | A | 4/2017 |
| KR | 10-2018-0064018 | A | 6/2018 |
| KR | 10-2019-0053739 | A | 5/2019 |
| KR | 10-2020-0057566 | A | 5/2020 |
| KR | 20200057566 | A | * 5/2020 .............. C09G 1/02 |
| KR | 10-2020-0062732 | A | 6/2020 |

OTHER PUBLICATIONS

Written Opinion for Singapore Patent Application No. 11202301527Y completed by the Intellectual Property Office of Singapore on Nov. 11, 2024.
Office Action for the Korean Patent Application No. 10-2021-0114855 issued by the Korean Intellectual Property Office on Feb. 5, 2024.
Office Action on the Chinese Patent Application No. 202180053079.2 issued by the Chinese Patent Office on Dec. 29, 2023.
International Search Report for the International Application No. PCT/KR2021/011691 issued by the International Searching Authority on Dec. 13, 2021.
Office Action for Korean Patent Application No. 10-2021-0114855 issued by the Korean Patent Office on Aug. 17, 2023.

* cited by examiner

[FIG. 1]
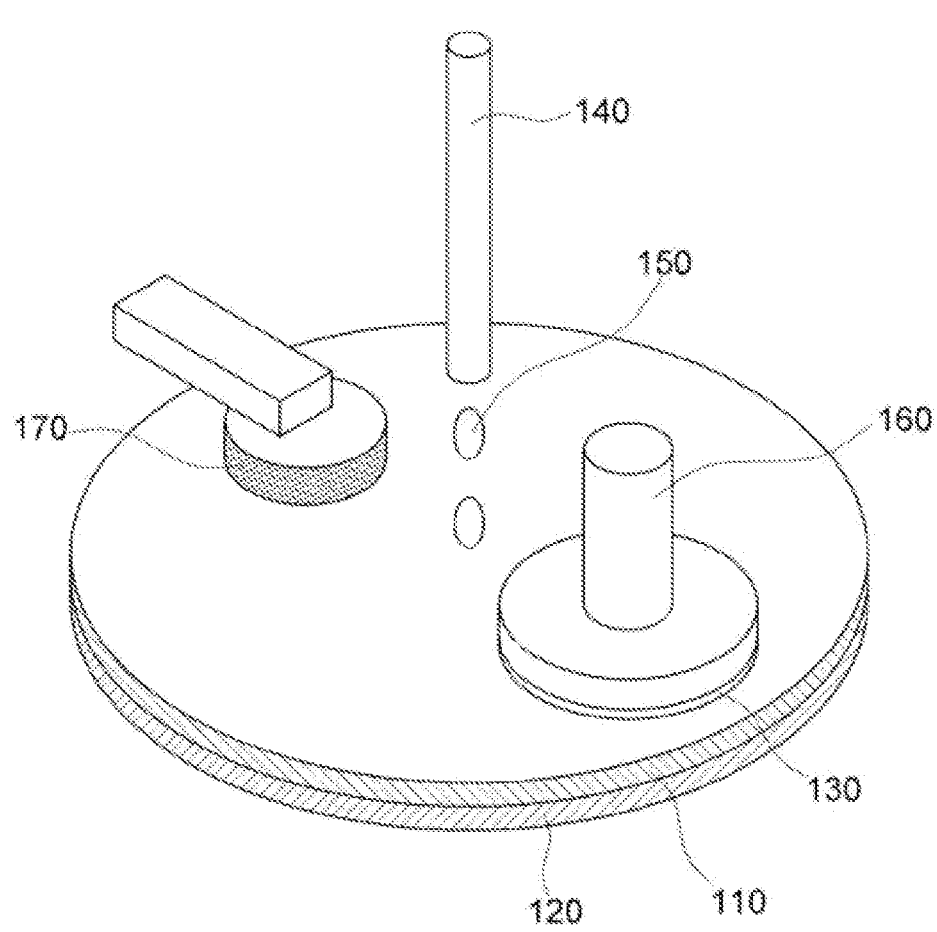

[FIG. 2]
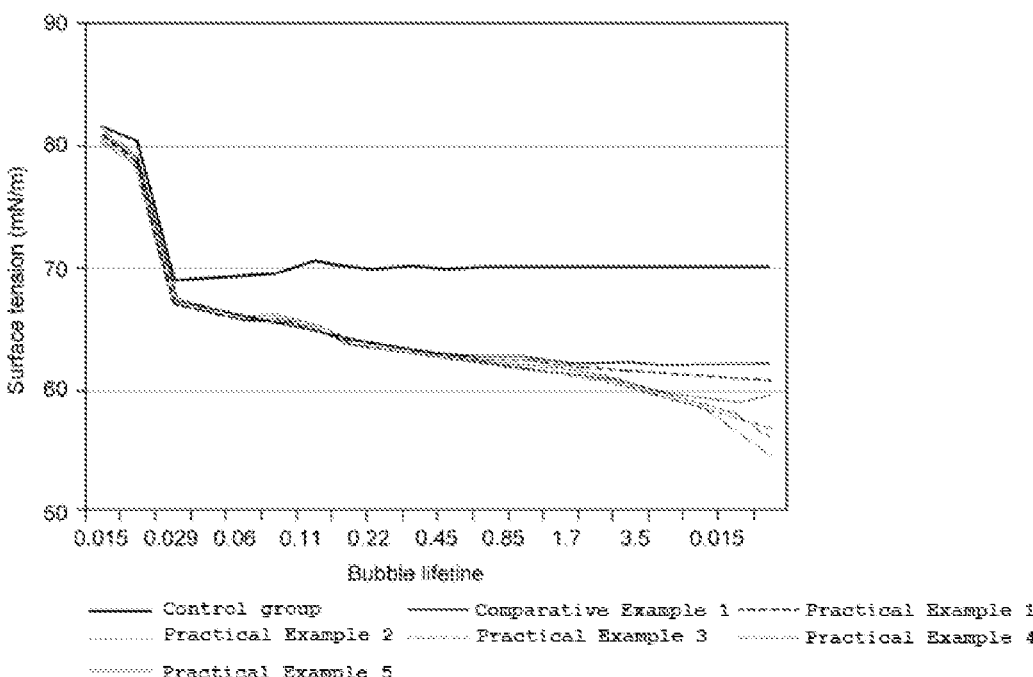

POLISHING COMPOSTION FOR SEMICONDUCTOR PROCESS, MANUFACTURING METHOD OF POLISHING COMPOSITION AND METHOD FOR MANUFACTURING SEMICONDUCTOR DEVICE BY USING THE SAME

This application is a national stage application of PCT/KR2021/011691 filed on Aug. 31, 2021, which claims priority to Korean Patent Application No. 10-2020-0109795 filed on Aug. 31, 2020, and Korean Patent Application No. 10-2021-0114855 filed on Aug. 30, 2021. The disclosure of each of the foregoing applications is incorporated herein by reference in its entirety.

TECHNICAL FIELD

The present disclosure relates to a polishing composition for a semiconductor process, a method of manufacturing the polishing composition, and a method of manufacturing a semiconductor device, the method that uses the polishing composition.

BACKGROUND ART

As semiconductor devices get more and more miniaturized and get higher and higher in density, technologies for forming a pattern smaller and smaller in size are employed. Accordingly, surface structures of the semiconductor devices become further complex, and topologies of inter-layer films also become more and more irregular. In manufacturing the semiconductor device, a chemical mechanical polishing (hereinafter referred to as "CMP") process is performed as a planarization technology for evening out any irregular topography of a specific film formed on a substrate.

During the CMP process, a slurry is provided on a polishing pad, and a surface of the substrate is polished while the substrate is pressurized and rotated. A target to be planarized varies according to a process step, and the slurry that is used in such a case also varies in physical property.

Specifically, the CMP process is performed for planarizing a dielectric, such as a silicon oxide ($SiO_2$) layer or a silicon nitride layer (SiN), and is also necessarily performed for planarizing a metal wiring line, such as a tungsten (W) wiring line or a copper (Cu) wiring line.

As semiconductor devices are downscaled at a high integration level, formation of a finer pattern, formation of a circuit with a multi-layer structure, and the like are required.

For this reason, there is a need for films formed of various different materials having different etch selectivity characteristics. Among the films formed of various materials, a carbon-based organic film has significant etch selectivity characteristics with respect to a film containing silicon and therefore may be used as a mask film or a sacrificial film.

In a process of manufacturing the semiconductor device, the organic film is required to be removed by the chemical mechanical polishing process being performed thereon. However, polishing compositions have not been developed that can efficiently polish the organic film used in the process of manufacturing the semiconductor device by performing the CMP process.

In order to solve the above-mentioned problem, there is a need for developing a polishing composition for a semiconductor process.

DISCLOSURE

Technical Problem

An object of the present disclosure is to provide a polishing composition for a semiconductor process, a method of manufacturing the polishing composition, and a method of manufacturing a semiconductor device, the method that uses the polishing composition.

Another object of the present disclosure is to provide a polishing composition for a semiconductor process that has an excellent polishing rate for an amorphous carbon layer, is supplied during a process of polishing the amorphous carbon layer, and prevents a carbon residue from adsorbing onto a substrate, thereby preventing a defect from occurring.

Still another object of the present disclosure is to provide a method of manufacturing a polishing composition that achieves high stability for storage by stabilizing an accelerator in the polishing composition.

Yet another object of the present disclosure is to provide a method of manufacturing a semiconductor device, the method that uses a polishing composition for a semiconductor process.

Technical Solution

In order to accomplish the above-mentioned objects, according to an aspect of the present disclosure, there is provided a polishing composition for a semiconductor process, the polishing composition containing an abrasive particle and a surfactant, and having a value, ranging from 0.5 to 2, which satisfies following Equation 1, ranges from 0.5 to 2:

$$\frac{Ra}{(100 + 100S)} \qquad \text{[Equation 1]}$$

where,
when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min,
Ra depicts a value of a polishing rate measured and
S depicts parts by weight of a surfactant per 100 parts by weight of abrasive particles.

According to another aspect of the present disclosure, there is provided a method of manufacturing a polishing composition for a semiconductor process, the method including: a step of manufacturing a polishing solution by placing a stabilizer and an accelerator into a solvent and mixing the solvent with the stabilizer and the accelerator; a step of adjusting a pH of the polishing solution by mixing the polishing solution with a pH adjuster; and a step of mixing the pH-adjusted polishing solution with a surfactant and an abrasive particle.

According to still another aspect of the present disclosure, there is provided a method of manufacturing a semiconductor device, the method including: 1) a step of providing a polishing pad including a polishing layer; 2) a step of supplying a polishing composition for a semiconductor process to the polishing pad; and 3) a step of polishing a polishing target while causing relative rotation of the polishing target in such a manner that a surface of the polishing target that is to be polished is brought into contact with a polishing surface of the polishing layer, wherein the polishing composition contains an abrasive particle and a surfactant.

Advantageous Effects

A polishing composition for a semiconductor process according to the present disclosure has an excellent polishing rate and is used for a CMP process for an amorphous carbon layer. The polishing composition can prevent a carbon residue occurring during the polishing process from adsorbing onto a semiconductor substrate and can prevent a polishing pad from being contaminated. The polishing composition has excellent stability for storage.

In addition, a method of manufacturing a semiconductor device, the method that uses the polishing composition for a semiconductor process, can be provided.

BRIEF DESCRIPTION OF DRAWINGS

FIG. 1 is a schematic view that is referred to for description of a process of manufacturing a semiconductor device according to an embodiment of the present disclosure.

FIG. 2 is a graph showing results of measuring surface tension according to an embodiment of the present disclosure.

BEST MODE

The present disclosure relates to a polishing composition for a semiconductor process that contains an abrasive particle and a surfactant and has a value, ranging from 0.5 to 2, which satisfies following Equation 1:

$$\frac{Ra}{(100 + 100S)} \qquad \text{[Equation 1]}$$

where, when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min, Ra depicts a value of a polishing rate measured and S depicts parts by weight of a surfactant per 100 parts by weight of abrasive particles.

MODE FOR INVENTION

Embodiments of the present disclosure will be described in detail below in such a manner that a person of ordinary skill in the art to which the present invention pertains is enabled to practice them without undue experimentation. However, the present disclosure may be embodied in various different forms and is not limited to the embodiments that will be described below.

When the expression "includes a certain constituent element" is used throughout the present specification, unless specifically stated otherwise, this expression means "may further include any other constituent element, not "excluding any other constituent element."

Throughout the present specification, a certain constituent element, when described as being "connected to one other constituent element, may be "directly connected to" one other constituent element or may be "indirectly connected to" one other constituent element with an intervening constituent element in between.

Throughout the present specification, that A is positioned on top of B means that A is in direct contact with B. Moreover, that A is positioned over B means that A is in indirect contact with an intermediary in between.

Throughout the present specification, the term "combination thereof" included in the expression in Markush format means a mixture or combination of one or more elements selected from the group consisting of elements and means one or more elements selected from the group consisting of the above-mentioned elements.

Throughout the present specification, the term "A and/or B" means "A, B, or A and B."

Throughout the present specification, unless specifically stated otherwise, the terms, "first," "second," and so forth or the terms "A," "B," and so forth are used to distinguish among the same terms.

Throughout the present specification, unless specifically stated otherwise, according to context, use of the singular form of a word is interpreted as including a singular meaning and including a meaning which includes the plural.

The embodiments of the present disclosure will be in more detail below.

As a semiconductor device gets more and more miniaturized and gets higher and higher in density, a surface structure thereof becomes more and more complex. The complexity of the above-mentioned surface structure means narrow-down of the line width of the semiconductor device. An aspect ratio is gradually increased, and a photoresist becomes thinner in order to be consistent with the aspect ratio that is gradually increased.

A phenomenon where the thinned and elongated photoresist does not remain unharmed and collapses occurs during an etching process. In order to prevent this phenomenon, a hard mask process is introduced.

Amorphous carbon and SiON are used as a material of the above-mentioned hard mask.

The above-mentioned amorphous carbon, when used as the material of the hard mask, has an excellent etching-resistant property. However, when a chemical mechanical polishing process is performed using a polishing composition in the related art, a carbon residue adsorbs onto a surface of a layer due to a low polishing rate and forming of a carbon residue, thereby causing a defect in a semiconductor substrate.

A polishing composition for a semiconductor process according to the present disclosure has a better polishing rate for the above-mentioned amorphous carbon layer than the polishing composition in the related art and prevents the carbon residue from adsorbing onto the surface of the layer, thereby possibly preventing the occurrence of the defect in the semiconductor substrate.

Specifically, the polishing composition for a semiconductor process according to the present disclosure contains an abrasive particle and a surfactant and has a value, ranging from 0.5 to 2, which satisfies following Equation 1.

$$\frac{Ra}{(100 + 100S)} \qquad \text{[Equation 1]}$$

where, when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min, Ra depicts a value of a polishing rate measured and S depicts parts by weight of a surfactant per 100 parts by weight of abrasive particles.

Specifically, the above-mentioned polishing composition for a semiconductor process according to the present disclosure contains an abrasive particle and a surfactant and has an excellent polishing rate for the above-mentioned amorphous carbon layer during a polishing process and reduces surface tension, thereby possibly preventing the carbon residue from re-adsorbing onto the semiconductor substrate.

More particularly, the polishing composition in the related art has a low polishing rate for the amorphous carbon layer. Accordingly, when the polishing composition in the related art is used for the polishing process, a large amount of time is taken for polishing, thereby causing the problem of low polishing efficiency.

Accordingly, in order to increase the polishing rate for the amorphous carbon layer, there is proposed a method of causing an accelerator described below to be contained in the polishing composition and thus increasing the polishing rate for the amorphous carbon layer. The above-mentioned polishing composition contains the accelerator and thus increases the polishing rate for the amorphous carbon layer. However, the carbon residue occurring during the polishing process re-adsorbs onto the semiconductor substrate, thereby increasing the occurrence of a defect in the semiconductor substrate.

In order to solve the above-mentioned problem of the occurrence of the defect, the polishing composition for a semiconductor process according to the present disclosure contains the surfactant and thus reduces surface tension of the polishing composition. The containing of the surfactant, As described above, the polishing composition contains the surfactant and thus prevents the carbon residue, which occurs during the polishing process, from re-adsorbing onto a surface of the semiconductor substrate, thereby possibly preventing the defect from occurring in the semiconductor substrate.

The polishing composition used for a process of manufacturing a semiconductor device has a polishing rate of 200 Å/min, preferably, 200 Å/min to 300 Å/min, and more preferably, 210 Å/min to 250 Å/min for the amorphous carbon layer, but is not limited to these polishing rates. The polishing composition with high efficiency may be provided when the polishing process is performed on the amorphous carbon layer within the above-mentioned scope of the present disclosure.

Following Equation 1 relates to a relationship among the polishing rate, the abrasive particle, and the surfactant for the polishing composition according to the present disclosure.

$$\frac{Ra}{(100 + 100S)} \qquad \text{[Equation 1]}$$

where, when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min, Ra depicts a value of a polishing rate measured and S depicts parts by weight of a surfactant per 100 parts by weight of abrasive particles.

Specifically, in a case where the value satisfying Equation 1 ranges from 0.5 to 2, preferably, 0.7 to 1.4 and where the value satisfying Equation 1 falls within the scope of the present disclosure, the polishing rate for the amorphous carbon layer can be increased, and a surface defect in the semiconductor substrate can be prevented.

A value of a denominator in the relationship given in Equation 1 relates to abrasive particle content and surfactant content. The above-mentioned surfactant is contained in small amount in the polishing composition, and thus reduces the surface tension of the polishing composition.

Specifically, 100 in the above-mentioned value of the denominator, means 100 parts by weight that refers to a range of a range of the abrasive particle content. In addition, the S of 100S in the above-mentioned value of the denominator means parts by weight for the surfactant per 100 parts by weight of abrasive particles, and 100 is a coefficient for reflecting the effect of suppressing the occurrence of the surface defect in the semiconductor substrate during the polishing process that uses the surfactant.

When the value satisfying Equation 1 falls within the scope of the present disclosure, the polishing rate for the amorphous carbon layer is excellent, and the carbon residue is prevented from re-adsorbing onto the surface of the semiconductor substrate during the polishing process, thereby possibly suppressing the occurrence of the defect in the semiconductor substrate.

The above-mentioned polishing composition contains 0.5 to 5 parts by weight, preferably 0.5 to 3 parts by weight, of the surfactant per 100 parts by weight of metal oxide particles. In a case where the surfactant and the metal oxide particles are mixed within the above-mentioned range and where a mixture thereof is used, the value satisfying Equation 1 falls within the scope of the present disclosure, the polishing rate for the above-mentioned amorphous carbon layer is excellent, and the carbon residue is prevented from re-adsorbing onto the surface of the semiconductor substrate during the polishing process, thereby possibly suppressing the occurrence of the defect in the semiconductor substrate.

The above-mentioned surfactant is not particularly limited as long as it is a material that serves to prevent a phenomenon such as the re-adsorption of the carbon residue onto the surface of the semiconductor substrate during the polishing process.

Specifically, the above-mentioned surfactant may contain a nonionic fluorine-based compound. The above-mentioned surfactant contains a fluorine-based compound. When the surfactant is used during the polishing process on the amorphous carbon layer, the carbon residue that occurs during the polishing process can be prevented from re-adsorbing onto the surface of the semiconductor substrate. In addition, the above-mentioned surfactant contains fluorine, and thus may suppress propagation of microorganisms, such as bacteria and fungi. When the polishing composition is stored for a long time, bacteria and fungi may grow in the polishing composition. The polishing composition in which the above-mentioned bacteria and fungi grow cannot be used for the polishing process and thus has to be discarded. The above-mentioned surfactant in the polishing composition according to the present disclosure contains a nonionic fluorine-based polymer compound. Thus, when the polishing composition is stored for a long time, bacteria and fungi can be prevented from growing. Thus, the stability of the polishing composition according to the present disclosure that is required for long-time storage can be increased.

Specifically, the above-mentioned surfactant according to the present disclosure may be selected from the group consisting of FS-30, FS-31, FS-34, ET-3015, ET-3150, and ET-3050 that are manufactured by the Chemours™ company, and a mixture thereof. However, the surfactant according to the present disclosure is not particularly limited as long as it is a material that serves to prevent a phenomenon such as the re-adsorption of the carbon residue onto the surface of the semiconductor substrate during the polishing process.

As the above-mentioned surfactant according to the present disclosure that is a nonionic surfactant, a surfactant containing a nonionic fluorine-based polymer compound may also be used alone or in mixture with another nonionic surfactant.

The above-mentioned nonionic surfactant may be selected from the group consisting of polyethylen glycol, polypropylene glycol, a polyethylene-propylene copolymer, a polyalkyl oxide, a polyoxyethylene oxide (PEO), and a polyethylene oxide, and a polypropylene oxide. A fluoro-surfactant may be selected from the group consisting of a sodium sulfonate fluorosurfactant, a phosphate ester fluoro-surfactant, an amine oxide fluorosurfactant, a betaine fluo-rosurfactant, an ammonium carboxylate fluorosurfactant, a stearate ester fluorosurfactant, a quaternary ammonium fluo-rosurfactant, an ethylene oxide/propylene oxide fluorosur-factant, and a polyoxyethylene fluorosurfactant.

The above-mentioned abrasive particle is an abrasive particle that may be available on the polishing composition for a semiconductor process. For example, the above-mentioned abrasive particle may be selected from the group consisting of a metal oxide, an organic particle, an organic-inorganic composite particle, and a mixture thereof, but is not limited thereto. The metal oxide may be selected from the group consisting of colloidal silica, fumed silica, ceria, alumina, titania, zirconia, zeolite and a mixture thereof, but is not limited thereto. An abrasive particle that is selectable by a person of ordinary skill in the art may be all used, without any limitation, as the above-mentioned abrasive particle.

The above-mentioned organic particle may be a polysty-rene, styrene-based copolymer, poly(meta) acrylate, (meta) acrylate-based copolymer, polyvinyl chloride, polyamide, polycarbonate, or polyimide polymer particle; or a particle, having a core/shell structure, in which the above-mentioned polymer constitutes a core, a shell, or both thereof. These may be used alone or in mixture. The above-mentioned organic particle may be manufactured by an emulsion polymerization method, a suspension polymerization method, or the like.

The above-mentioned abrasive particle according to the present disclosure may be selected from the group consisting of colloidal silica, fumed silica, ceria, and a mixture thereof.

The above-mentioned abrasive particle may have a diam-eter $D_{50}$ of 10 nm to 120 nm, preferably a diameter $D_{50}$ of 20 nm to 100 nm, and more preferably a diameter $D_{50}$ of 20 nm to 60 nm. In a case where the above-mentioned diameter $D_{50}$ of the abrasive particle is in the above-mentioned range, a defect in a polishing-target substrate, such as a scratch, can be reduced, and the dispersibility of the abrasive particle can be improved. Specifically, in a case where the abrasive particle having the diameter $D_{50}$ in the above-mentioned range is used, the dispersibility of the abrasive particle can be improved, and thus a phenomenon where particles in the polishing composition agglomerate does not occur. Accord-ingly, the defect due to the abrasive particles, such as the scratch, can be prevented from occurring.

The above-mentioned polishing composition may addi-tionally contain an accelerator, a stabilizer, and a pH adjuster.

The above-mentioned accelerator may be selected from the group consisting of an anionic small molecule, an anionic high molecule, a hydroxyl acid, an amino acid, and a cerium salt. Specifically, the above-mentioned cerium salt may be a trivalent cerium salt or a tetravalent cerium salt. More specifically, the above-mentioned tetravalent cerium salt may be selected from the group consisting of cerium sulfate (IV) $(Ce(SO_4)_2)$, ammonium cerium sulfate dihy-drate, and cerium ammonium nitrate, but is not limited thereto.

The above-mentioned accelerator is contained in the polishing composition, and oxidizes a surface layer of the amorphous carbon layer to an oxide or an ion, thereby making it easy to remove the surface layer of the amorphous carbon layer.

In addition, the above-mentioned accelerator makes it easy to remove a residue of an organic-layer material that is present in a polishing stopping layer and thus has the advantage of making it possible to perform polishing more uniformly.

The above-mentioned cerium ammonium nitrate may be present, in the form of an ionic compound or a chelate compound, in a slurry composition. In a case where the above-mentioned cerium ammonium nitrate is used in the above-mentioned form, it is possible that the amorphous carbon layer is polished at a high polishing speed.

In order to increase the polishing rate for the amorphous carbon layer, the polishing composition according to the present disclosure contains an accelerator and a stabilizer. Thus, it is possible that a high polishing rate for the amorphous carbon layer is achieved by the accelerator. Moreover, it is possible that the polishing composition according to the present disclosure is stored by the stabilizer for a long time. In addition, when the polishing process is performed, the carbon residue can be prevented from re-adsorbing onto the semiconductor substrate, thereby pre-venting the surface defect in the semiconductor substrate.

Accordingly, since the polishing composition according to the present disclosure contains the accelerator and the stabilizer, the polishing rate for the amorphous carbon layer can be increased by the accelerator, the stability of the polishing composition can be increased by the stabilizer, and the carbon residue can be prevented from re-adsorbing onto the semiconductor substrate during the polishing process, thereby possibly preventing the occurrence of the defect.

Specifically, the above-mentioned stabilizer is amino acids. More specifically, the above-mentioned amino acid may be selected from the group consisting of arginine, histidine, lysine, an aspartic acid, a glutamic acid, gluta-mine, cysteine, proline, asparagine, threonine, alanine, gly-cine, valine, leucine, isoleucine, and a mixture thereof. Preferably, the above-mentioned amino acid is alanine, but is not limited thereto. Any amino acid is usable without any limitation as long as it can be used in mixture with the accelerator, can increase the stability of the polishing com-position, and can suppress the occurrence of the defect during the polishing process.

The above-mentioned pH adjuster may be at least one selected from the group consisting of a hydrochloric acid, a phosphoric acid, a sulfuric acid, a fluoric acid, a nitric acid, a bromic acid, an iodic acid, a formic acid, a malonic acid, a maleic acid, an oxalic acid, an acetic acid, an adipic acid, a citric acid, an adipic acid, an acetic acid, a propionic acid, a fumaric acid, an oleic acid, a salicylic acid, pimelin acid, a benzoic acid, a succinic acid, a phthalic acid, a butyric acid, a glutaric acid, a glutamic acid, a glycolic acid, a lactic acid, an asparagic acid, a tartaric acid, and potassium hydroxide.

The above-mentioned pH adjuster may adjust the pH of the polishing composition for a semiconductor process to 2 to 5, preferably, 2 to 4. In a case where an acidic environment is maintained in this range, each of the polishing speed and quality can be maintained at a predetermined level or above while excessive corrosion of a metal component or a polishing apparatus is maintained.

400 parts by weight to 800 parts by weight of the above-mentioned accelerator may be used per 100 parts by weight of abrasive particles in the above-mentioned polishing composition. Specifically, 450 parts by weight to 700 parts by weight, preferably 450 parts by weight to 550 parts by weight of the above-mentioned accelerator may be used per 100 parts by weight of abrasive particles in the above-mentioned polishing composition.

350 parts by weight to 750 parts by weight of the above-mentioned stabilizer may be used per 100 parts by weight of abrasive particles in the polishing composition. Specifically, 400 parts by weight to 600 parts by weight, preferably 430 parts by weight to 500 parts by weight of the above-mentioned stabilizer may be used per 100 parts by weight of abrasive particles in the above-mentioned polishing composition.

0.4 parts by weight to 5 parts by weight of the above-mentioned surfactant may be used per 100 parts by weight of abrasive particles in the above-mentioned polishing composition. Specifically, 0.5 parts by weight to 2 parts by weight, preferably 0.6 parts by weight to 1.5 parts by weight of the above-mentioned surfactant may be used per 100 parts by weight of abrasive particles in the above-mentioned polishing composition.

The above-mentioned accelerator, stabilizer, and surfactant may be mixed into a solvent, and a mixture thereof may be provided as the above-mentioned polishing composition.

The above-mentioned solvent is ultra-pure water, but is not limited thereto. Any solvents that may be available as a solvent for the polishing composition may be used without any limitation.

In a case where the above-mentioned accelerator, stabilizer, and surfactant are contained, in the above-mentioned ranges, respectively, in the polishing composition, the accelerator can be stabilized by the stabilizer, and thus the polishing rate can be increased by the accelerator in the polishing composition. In addition, the polishing composition can be stored for a longer time.

In addition, the above-mentioned stabilizer and surfactant can prevent the defect from occurring during the polishing process that uses the polishing composition.

In a case where the above-mentioned surfactant is contained below the above-mentioned range, there occurs a problem in that the occurrence of the surface defect in the semiconductor substrate is increased during the polishing process. In a case where the above-mentioned surfactant is contained above the above-mentioned range, there occurs a problem in that a bubble occurs in large quantity when the polishing composition is manufactured.

The above-mentioned polishing composition for a semiconductor process may contain a solid content of approximately 5% to 20% by weight. In a case where the above-mentioned solid content is excessively low, there is a concern that the polishing rate for the amorphous carbon layer will not be sufficiently ensured. In a case where the above-mentioned solid content is excessively high, there is a concern that the defect will occur due to aggregation of the abrasive particles or the like. That is, in a case where the above-mentioned polishing composition for a semiconductor process contains the above-described components and the above-mentioned solvent and satisfies a requirement for the solid content in the above-mentioned range, the above-mentioned polishing composition for a semiconductor process, when used during the polishing process, may be advantageously injected at a uniform flowing speed. In addition, the uniform dispersibility and the storage safety can be advantageously ensured while the above-mentioned polishing composition for a semiconductor process is distributed and stored.

A method of manufacturing a polishing composition for a semiconductor process according to the present disclosure includes: a step of manufacturing a polishing solution by placing a stabilizer and an accelerator into a solvent and mixing the solvent with the stabilizer and the accelerator; a step of adjusting a pH of the above-mentioned polishing solution by mixing the above-mentioned polishing solution with a pH adjuster; and a step of mixing the above-mentioned pH-adjusted polishing solution with a surfactant and an abrasive particle. A value satisfying following Equation 1 ranges from 0.5 to 2.

$$\frac{Ra}{(100 + 100S)} \qquad \text{[Equation 1]}$$

where, when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min, Ra depicts a value of a polishing rate measured and S depicts parts by weight of a surfactant per 100 parts by weight of abrasive particles.

In the step of manufacturing the above-mentioned polishing solution, a first polishing solution may be manufactured by mixing a stabilizer with the solvent in order to stabilize the accelerator, and then the polishing solution may be manufactured by mixing the first polishing solution with the accelerator.

When the polishing composition is manufactured by mixing ultra-pure water, that is, a solvent, with the above-mentioned accelerator, together with the stabilizer, the pH adjuster, the surfactant, and the abrasive particle, the above-mentioned accelerator is not stabilized. Thus, the polishing composition, when manufactured in this manner, is difficult to store for a long time, or the effect of increasing the polishing rate for the amorphous carbon layer using the accelerator is not achieved.

In order to prevent these problems, the first polishing solution is manufactured by mixing the solvent with the stabilizer, and then the polishing solution is manufactured by dissolving the accelerator into the first polishing solution. Subsequently, the pH of the polishing solution is adjusted by mixing the above-mentioned polishing solution with the pH adjuster, and the polishing composition is manufactured by mixing the above-mentioned pH-adjusted polishing solution with the surfactant and the abrasive particle. Due to the accelerator, the polishing composition for a semiconductor process that is manufactured using the above-mentioned manufacturing method has an excellent polishing rate for the amorphous carbon layer and an excellent stability. Thus, it is possible to store the polishing composition for a long time.

A method of manufacturing a semiconductor device according to another embodiment of the present disclosure includes: 1) a step of providing a polishing pad including a polishing layer; 2) a step of supplying a polishing composition for a semiconductor process to the polishing pad; and 3) a step of polishing a polishing target while causing relative rotation of the polishing target in such a manner that a surface of the polishing target that is to be polished is brought into contact with a polishing surface of the polishing layer. The above-mentioned polishing composition contains an abrasive particle and a surfactant. A value satisfying Equation 1 ranges from 0.5 to 2.

$$\frac{Ra}{(100 + 100S)} \qquad \text{[Equation 1]}$$

where, when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min, Ra depicts a value of a polishing rate measured and S depicts parts by weight of a surfactant per 100 parts by weight of abrasive particles.

FIG. 1 is a schematic view that is referred to for description of a process of manufacturing a semiconductor device according to an embodiment of the present disclosure. With reference to FIG. 1, a polishing pad 110 according to the present embodiment is mounted on top of a surface plate 120, and then, a semiconductor substrate 130 that is a polishing target is arranged on top of the polishing pad 110. For polishing, a polishing slurry 150 is sprayed onto the polishing pad 110 through a nozzle 140.

An amount of the flowing polishing slurry 150 supplied through the above-mentioned nozzle 140 may be selected, according to purpose, from a range from approximately 10 cm³/minute to approximately 1,000 cm³/minute. For example, the amount of the flowing polishing slurry 150 may be approximately 50 cm³/minute to approximately 500 cm³/minute, but is not limited thereto.

The surface of the above-mentioned semiconductor substrate 130 that is to be polished is brought into direct contact with a polishing surface of the above-mentioned polishing pad 110.

Subsequently, the semiconductor substrate 130 and the polishing pad 110 may be rotated relative to each other and the surface of the semiconductor substrate 130 may be polished. At this point, a rotational direction of the semiconductor substrate 130 and a rotational direction of the polishing pad 110 may be the same as or opposite to each other. The rotational speeds of the above-mentioned semiconductor substrate 130 and polishing pad 110 may be selected, according to purpose, from a range from approximately 10 rpm to approximately 500 rpm. For example, the rotational speeds thereof may be approximately 30 rpm to approximately 200 rpm, but are not limited thereto.

As an example of the above-mentioned process of polishing the substrate, that polishes the substrate may be used for a polishing process for a carbon-based organic layer that is an organic layer.

Specifically, examples of the above-mentioned carbon-based organic layer may include a C-spin on hard mask (C—SOH) layer, an amorphous carbon layer, and an NCP layer. Preferably, the above-mentioned carbon-based organic layer is an amorphous carbon layer that has an excellent selective polishing effect and is capable of achieving a high polishing rate.

A detailed description of the polishing composition for a semiconductor process is the same as described above and is omitted.

In one implementation example, the method of manufacturing a semiconductor device may further include a step of polishing the semiconductor substrate 130 and, at the same time, processing the polishing surface of the polishing pas 110 through a conditioner 170 in order to keep the polishing surface of the polishing pad 110 suitable for polishing.

Manufacturing of the Polishing Composition for a Semiconductor Process

Practical Example 1

A first polishing solution was manufactured by mixing ultra-pure water with alanine, that is, a stabilizer, a. A polishing solution was manufactured by mixing the above-mentioned first polishing solution with cerium ammonium nitrate, that is, an accelerator.

A pH of the above-mentioned polishing solution was adjusted to 2.1 by mixing the above-mentioned polishing solution with a nitric acid. A polishing composition was manufactured by mixing the pH-adjusted polishing solution with FS-30, that is, a surfactant, manufactured by the Chemours™ company and colloidal silica with a diameter of 75 nm.

Practical Example 2

A polishing composition was manufactured in the same manner as in Practical Example 1, except that 2 parts by weight of the above-mentioned surfactant is contained per 100 parts by weight of colloidal silica.

Practical Example 3

A polishing composition was manufactured in the same manner as in Practical Example 1, except that histidine was used instead of the above-mentioned alanine.

Practical Example 4

A polishing composition was manufactured in the same manner as in Practical Example 1, except that proline was used instead of the above-mentioned alanine.

Practical Example 5

A polishing composition was manufactured in the same manner as in Practical Example 1, except that arginine was used instead of the above-mentioned alanine.

Comparative Example 1

Ultra-pure water was used as Comparative Example 1.

13 | 14

Comparative Example 2

A polishing composition was manufactured in the same manner as in Practical Example 1, except that a surfactant was not separately contained.

Comparative Example 3

A polishing composition was manufactured in the same manner as in Practical Example 1, except that a pyridine salt, that is, a cationic surfactant, were used as a surfactant.

Comparative Example 4

A polishing composition was manufactured in the same manner as in Practical Example 1, except that Tween® 20, that is, a non-ionic surfactant, was used as a surfactant.

Specific content of the polishing composition in Practical Examples 1 to 5 and Comparative Examples 1 to 4 are as follows.

A SITA Bubble Pressure Tensionmeter was used as a measuring instrument. For measurement, an amount of sample was adjusted to 100 ml, and then the bubble life times on liquid-phase surfaces due to the surface tensions were measured. The results are shown in Table 2.

It can be seen that when the bubble life time is lengthened, the ultra-pure water as Control Group does not change at a value of specific surface tension.

It can be seen that in Comparative Example 1 and Practical Examples 1 and 2, as the bubble lift time is lengthened, the surface tension is decreased due to a component of the polishing composition, when compared with Control Group, but that, in Practical Examples 1 and 2, as surfactant content is increased, the surface tension is decreased when compared with the case with Comparative Example 1. Specifically, this result is understood to mean that since the surface tension is decreased, a carbon residue can be prevented from re-adsorbing onto a surface of a

TABLE 1

| | | Practical Example 1 | Practical Example 2 | Practical Example 3 | 4 | Example 5 | Comparative Example 1 | Comparative Example 2 | Comparative Example 3 | Comparative Example 4 |
|---|---|---|---|---|---|---|---|---|---|---|
| Abrasive Particle | Colloidal silica | 0.25 (100 parts by weight) | 0.25 (100 parts by weight) | 0.25 (100 parts by weight) | 0.25 (100 parts by weight) | 0.25 (100 parts by weight) | | 0.25 (100 parts by weight) | 0.25 (100 parts by weight) | 0.25 (100 parts by weight) |
| Stabilizer | Alanine | 1.19 (476 parts by weight) | 1.19 (476 parts by weight) | — | — | — | | 1.19 (476 parts by weight) | 1.19 (476 parts by weight) | 1.19 (476 parts by weight) |
| | Histidine | — | — | 1.19 (476 parts by weight) | — | — | | — | — | — |
| | Proline | — | — | — | 1.19 (476 parts by weight) | — | | — | — | — |
| | Arginine | — | — | — | — | 1.19 (476 parts by weight) | | — | — | — |
| Accelerator | Cerium ammonium nitrate | 1.3 (520 parts by weight) | 1.3 (520 parts by weight) | 1.3 (520 parts by weight) | 1.3 (520 parts by weight) | 1.3 (520 parts by weight) | | 1.3 (520 parts by weight) | — | — |
| Surfactant | FS-30 | 0.002 (0.8 parts by weight) | 0.005 (2 parts by weight) | 0.002 (0.8 parts by weight) | 0.002 (0.8 parts by weight) | 0.002 (0.8 parts by weight) | — | — | — | — |
| | Pyridine salt | — | — | — | — | — | — | — | 0.002 (0.8 parts by weight) | — |
| | Tween ® 20 | — | — | — | — | — | — | — | — | 0.002 (0.8 parts by weight) |
| Solvent | Ultra-pure water | | | | | the rest | | | | |

(Unit Weight %)

Experimental Example 1

Measurement of Surface Tensions

With ultra-pure water being used as Control Group, bubble life times in Comparative Example 1 and Practical Examples 1 and 2 were measured, and surface tensions were evaluated.

substrate, thereby possibly decreasing occurrence of the defect in the semiconductor substrate during the polishing process.

In contrast, in Comparative Examples 2 to 4, the polishing compositions were manufactured with different types of surfactants, but aggregation occurred on the polishing compositions. For this reason, it was impossible to conduct an experiment for additional evaluation.

Experimental Example 2

Polishing Rate and Whether or not a Surface Defect Occurs in the Semiconductor Substrate A polishing process was performed in order to check a polishing rate and whether or not a surface defect occurs in the semiconductor substrate in a case where the polishing composition according to the present disclosure is used for the polishing process. The polishing rate was measured, and whether or not the surface defect occurred was checked.

A polishing process condition was that specifically, an amorphous carbon layer (ACL) with a thickness of 2,000 Å was pressurized at a pressure of 2 psi for 60 seconds, a speed of a carrier was 87 rpm, a speed of a platen was 93 rpm, and an inflow speed of a polishing composition was 200 ml/min.

Under the above-mentioned polishing condition, the polishing rate for the amorphous carbon layer was measured, and whether or not the defect occurred was checked using KLA Tencor AIT-XP+.

A value satisfying following Equation 1 is computed using the measured polishing rate, parts by weight of the above-mentioned abrasive particles, and parts by weight of the surfactant.

$$\frac{Ra}{(100 + 100S)} \qquad \text{[Equation 1]}$$

where

Ra depicts a polishing rate measured and

S is parts by weight of a surfactant per 100 parts by weight of abrasive particles.

TABLE 2

| | Removal Rate (Å/min) | Value satisfying Equation 1 | Total number of defects (ea) | Carbon residue (ea) | Particle (ea) |
|---|---|---|---|---|---|
| Comparative Example 2 | 240 | 2.4 | 24,242 | 50 | 9 |
| Practical Example 1 | 242 | 1.34 | 16,364 | 43 | 1 |
| Practical Example 2 | 232 | 0.77 | 15,622 | 40 | 0 |
| Practical Example 3 | 230 | 1.28 | 15,645 | 41 | 0 |
| Practical Example 4 | 225 | 1.25 | 15,981 | 40 | 0 |
| Practical Example 5 | 231 | 1.28 | 15,716 | 42 | 0 |

From Table 2, it can be seen that there is no significant difference in the polishing rate for the amorphous carbon layer when Comparative Example 2 and Practical Examples 1 to 5 are compared. Specifically, it can be seen that in Practical Examples 1 to 5, the polishing rates for the amorphous carbon layer exceeds 200 Å/min and are approximately at the same level when compared with the case with Comparative Example 2. However, it can be seen that there are significant differences in the number of defects occurring during the polishing process when Comparative Example 2 and Practical Examples 1 to 5 are compared.

The above-mentioned experimental results show that the difference in the polishing rate for the amorphous carbon layer occurred due to the contained accelerator. It can be seen that in Practical Examples 1 to 5 and Comparative Example 2 in all of which the accelerator was contained, the polishing rates for the amorphous carbon layer all exceed 200 Å/min. However, it can be seen that in a case where the surfactant was not contained, an amount of the carbon residue is increased and thus the number of the defects is increased.

Consequently, it can be seen that in Practical Examples 1 to 5 to which the value satisfying Equation 1 applied, the polishing rates for the amorphous carbon layer are excellent and that the effect of preventing the defect from occurring after the polishing process is excellent.

The preferred embodiments of the present disclosure are described in detail above but impose no limitation on the claimed scope of the present disclosure. Various modifications and improvements that a person of ordinary skill in the art makes using the fundamental concept of the present disclosure that is defined in the following claims also fall within the claimed scope of the present disclosure.

DESCRIPTION OF THE REFERENCE NUMERALS IN THE DRAWINGS

110: Polishing Pad
120: Surface Plate
130: Semiconductor Substrate
140: Nozzle
150: Polishing Slurry
160: Polishing Head
170: Conditioner

INDUSTRIAL APPLICABILITY

The present disclosure relates to a polishing composition for a semiconductor process, a method of manufacturing the polishing composition, and a method of manufacturing a semiconductor device, the method that uses the polishing composition.

The invention claimed is:

1. A polishing composition for a semiconductor process, the polishing composition containing an abrasive particle, an accelerator, a stabilizer and a surfactant, wherein the accelerator comprises a cerium salt, wherein the stabilizer is an amino acid, wherein the surfactant contains a nonionic fluorine-based polymer compound, and wherein the polishing composition contains 0.5 to 5 parts by weight of the surfactant, 350 parts by weight to 750 parts by weight of the stabilizer, and 400 parts by weight to 800 parts by weight of the accelerator per 100 parts by weight of abrasive particles, and has a value, ranging from 0.5 to 2, which satisfies following Equation 1:

$$\frac{Ra}{(100 + 100S)} \qquad \text{[Equation 1]}$$

where, when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min, Ra depicts a value of a polishing rate measured in Å/min and S depicts parts by weight of a surfactant per 100 parts by weight of abrasive particles.

2. The polishing composition of claim 1, wherein the abrasive particle is selected from the group consisting of a metal oxide, an organic particle, an organic-inorganic composite particle, and a mixture thereof.

3. The polishing composition of claim 1, containing a pH adjuster.

4. A method of manufacturing a semiconductor device, the method comprising:

1) a step of providing a polishing pad including a polishing layer;

2) a step of supplying the polishing composition of claim 1 to the polishing pad; and 3) a step of polishing a polishing target while causing relative rotation of the polishing target in such a manner that a surface of the polishing target that is to be polished is brought into contact with a polishing surface of the polishing layer.

5. A method of manufacturing a polishing composition for a semiconductor process, the method comprising:

a step of manufacturing a polishing solution by placing a stabilizer and an accelerator into a solvent and mixing the solvent with the stabilizer and the accelerator, where in the accelerator comprises a cerium salt, wherein the stabilizer is an amino acid;

a step of adjusting a pH of the polishing solution by mixing the polishing solution with a pH adjuster; and a step of mixing the pH-adjusted polishing solution with a surfactant and an abrasive particle, wherein the surfactant contains a nonionic fluorine-based polymer compound, and

wherein the polishing composition contains the abrasive particle, the accelerator, the stabilizer, and the surfactant, wherein the polishing composition contains 0.5 to 5 parts by weight of the surfactant, 350 parts by weight to 750 parts by weight of the stabilizer, and 400 parts by weight to 800 parts by weight of the accelerator per 100 parts by weight of abrasive particles and has a value, ranging from 0.5 to 2, which satisfies following Equation 1:

$$\frac{Ra}{(100 + 100S)} \qquad \text{[Equation 1]}$$

where, when an amorphous carbon layer (ACL) with a thickness of 2,000 Å is pressurized at a pressure of 2 psi for 60 seconds and polishing is performed under the condition that a speed of a carrier is 87 rpm, that a speed of a platen is 93 rpm, and that an inflow speed of a polishing composition is 200 ml/min, Ra depicts a value of a polishing rate measured in Å/min and S depicts parts by weight of a surfactant per 100 parts by weight of abrasive particles.

6. The method of claim 5, wherein in the step of manufacturing the polishing solution, a first polishing solution is manufactured by mixing the solvent with a stabilizer, and the first polishing solution is mixed with an accelerator.

* * * * *